US007326517B2

(12) United States Patent
Matsumura

(10) Patent No.: US 7,326,517 B2
(45) Date of Patent: Feb. 5, 2008

(54) PLANOGRAPHIC PRINTING PLATE MATERIAL AND PREPARING PROCESS OF PLANOGRAPHIC PRINTING PLATE

(75) Inventor: Toshiyuki Matsumura, Fujino-machi (JP)

(73) Assignee: Konica Minolta Medical & Graphic, Inc. (JP)

( * ) Notice: Subject to any disclaimer, the term of this patent is extended or adjusted under 35 U.S.C. 154(b) by 110 days.

(21) Appl. No.: 11/098,624

(22) Filed: Apr. 4, 2005

(65) Prior Publication Data

US 2005/0260524 A1 Nov. 24, 2005

(30) Foreign Application Priority Data

Apr. 12, 2004 (JP) ............................ 2004-116914

(51) Int. Cl.
*G03F 7/00* (2006.01)
*G03F 7/004* (2006.01)

(52) U.S. Cl. .................. 430/270.1; 430/302; 430/944; 430/945; 430/913; 430/914; 430/926

(58) Field of Classification Search ............ 430/270.1, 430/302, 944, 945, 913, 914, 926
See application file for complete search history.

(56) References Cited

U.S. PATENT DOCUMENTS 6,727,044 B1 * 4/2004 Fujimaki et al. ......... 430/284.1
2004/0191694 A1 * 9/2004 Kiyoyama et al. .......... 430/302

FOREIGN PATENT DOCUMENTS

| | | |
|---|---|---|
| EP | 1 288 720 A1 | 3/2003 |
| EP | 1 391 784 A2 | 2/2004 |
| EP | 1 403 710 A1 | 3/2004 |
| JP | 01-105238 | 4/1989 |
| JP | 02-127404 | 5/1990 |

OTHER PUBLICATIONS

Yamada et al "Electron Transfer of Manganese Halogenated Tetraphenylporphyrin Derivatives Assemled on Gold Electrodes", Langmuir, 17(15), 4634-4640, 2001.*
Neithammer et al. "ENDOR Studies of Alkali Metal Complexes of Porphyrin-Semiquinone Derivatives", Magnetic Resonance and the Structure of Matter conference, 1995.*
Kosal et al "Microporous Porphyrin and Metallopophyrin Materials", Journal of Solid State Chemistry, 152, 87-89 (2000).*
Porphyrin compound Product information from www.sigmaaldrich.com online catalog, first referenced in 1961 (www.sigmaaldrich.com/catalog/search/ProductDetail?ProdNo=254754&Brand=ALDRICH).*
European Search Report for Application No. 05252117.6-2304 dated Jul. 14, 2005.

* cited by examiner

*Primary Examiner*—Amanda C. Walke
(74) *Attorney, Agent, or Firm*—Cantor Colburn LLP

(57) ABSTRACT

A photosensitive composition containing: (A) a sensitizing dye; (B) a photopolymerization initiator; (c) a polymerizable compound having an ethylenically unsaturated bond; and (D) a polymer binder, wherein the photopolymerization initiator exhibits a reaction rate constant with a semiquinone radical anion in the range of $2.0\times10^2$ to $1.0\times10^8$ ($mol^{-1}\cdot l\cdot s^{-1}$).

12 Claims, No Drawings

PLANOGRAPHIC PRINTING PLATE MATERIAL AND PREPARING PROCESS OF PLANOGRAPHIC PRINTING PLATE

This application is based on Japanese Patent Application No. 2004-116914 filed on Apr. 12, 2004 in Japanese Patent Office, the entire content of which is hereby incorporated by reference.

FIELD OF THE INVENTION

The present invention relates to a planographic printing plate material of a photopolymerization type used for a computer to plate system (hereafter it is called as a CTP system) and to a preparation method employing the same. More particularly, the present invention relates to a planographic printing plate material of a photopolymerization type which improves a storage stability, a performance stability and developing properties, and also to a method of preparing a planographic printing plate employing the same.

BACKGROUND OF THE INVENTION

In recent years, as a printing plate for off-set printing, a large number of computer to plate (CTP) systems have been developed and put into practical use, which imagewise exposes directly to a planographic printing plate material employing laser light based on digital image data to record an image on the material.

Among them, in a printing plate making field in which a fairly high printing durability is required, it is known a negative type planographic printing plate material having a photosensitive layer containing a polymerizable compound.

Proposed as polymerization initiators employed in a polymerizable photosensitive layer are s-triazine compounds having a trichloromethyl group described, for example, in Japanese Patent Publication Open to Public Inspection hereinafter refereed to as JP-A) Nos. 48-36281, 54-74887, and 64-35548, iron arene complexes and peroxides described, for example, in JP-A No. 59-219307, monoalkyltriaryl borates described, for example, in JP-A Nos. 62-150242, 62-143044, and 64-35548, titanocene compounds described, for example, in JP-A Nos. 63-41483 and 2-291.

However, the photographic speed of photosensitive lithographic printing materials having a photosensitive layer employing these polymerization initiators has been insufficient and an increase has been sought.

Further, a technique has been proposed in which a tertiary amino group is introduced into the structure of compounds containing a polymerizable ethylenic double bond, and trihalogenated methyl-s-triazine compounds are simultaneously employed as a polymerization initiator. This technique has resulted in an increase in photographic speed, while the resulting length-of-run capacity was insufficient (refer to Patent Document 1).

In addition, a technique has been proposed in which a tertiary amino group is introduced into the structure of ethylenic double bond containing compounds, and trihalogenated methyl-s-triazine compounds are incorporated as a polymerization initiator, and further metallocene compounds such as titanocenes are simultaneously employed. This technique resulted in an increase in photographic speed, however the resulting length-of-run capacity was still insufficient (refer to Patent Document 2).

(Patent Document 1) JP-A No. 1-105238

(Patent Document 1) JP-A No. 2-127404

SUMMARY OF THE INVENTION

An object of the present invention is to provide a photosensitive composition exhibiting high sensitivity and high printing durability, and a planographic printing plate material using the same composition.

An aspect of the present invention includes a photosensitive composition, containing:

(A) a sensitizing dye;

(B) a photopolymerization initiator;

(c) a polymerizable compound having an ethylenically unsaturated bond; and (D) a polymer binder, wherein the photopolymerization initiator exhibits a predetermined high reaction rate constant with a semiquinone radical anion.

DESCRIPTION OF THE PREFERRED EMBODIMENTS

These and other objects of the present invention are accomplished by the following structures.

(1) A photosensitive composition, containing:

(A) a sensitizing dye;

(B) a photopolymerization initiator;

(c) a polymerizable compound having an ethylenically unsaturated bond; and (D) a polymer binder, wherein the photopolymerization initiator exhibits a reaction rate constant with a semiquinone radical anion in the range of $2.0\times10^2$ to $1.0\times10^8$ ($mol^{-1}\cdot l\cdot s^{-1}$).

(2) The photosensitive composition of the above-described item 1, wherein the photopolymerization initiator exhibits a reaction rate constant with a semiquinone radical anion in the range of $1.0\times10^4$ to $1.0\times10^8$ ($mol^{-1}\cdot l\cdot s^{-1}$).

(3) The photosensitive composition of claim 1, wherein the photopolymerization initiator is a halide compound having a carbon-halogen bond in the molecule.

(4) The photosensitive composition of the above-described items 1 or 2, wherein the photopolymerization initiator is a porphyrin metal complex.

(5) The photosensitive composition of the above-described items 1 or 2, wherein the sensitizing dye is a coumarin derivative.

(6) The photosensitive composition of the above-described items 1 or 2, wherein the sensitizing dye is a styryl dye.

(7) The photosensitive composition of the above-described items 1 or 2, wherein the sensitizing dye is a boron containing compound.

(8) The photosensitive composition of the above-described items 1 or 2, wherein the sensitizing dye is a cyanine dye.

(9) The photosensitive composition of the above-described items 1 or 2, wherein the sensitizing dye is a squarylium dye.

(10) A planographic printing plate material, comprising a support having thereon a photosensitive layer containing the photosensitive composition of the above-described items 1 or 2.

(11) A method of forming a planographic printing plate, comprising the steps of:

irradiating a portion of the planographic printing plate material of the above-described item 10 with a laser having an emission wavelength between 350 and 450 nm so as to polymerize the polymerizable compound in the irradiated portion; and developing the irradiated planographic printing plate material to eliminate a non-irradiated portion of the planographic printing plate material.

(12) A method of forming a planographic printing plate, comprising the steps of:

irradiating a portion of the planographic printing plate material of the above-described item 10 with a laser having an emission wavelength between 750 and 900 nm so as to polymerize the polymerizable compound in the irradiated portion; and developing the irradiated planographic printing plate material to eliminate a non-irradiated portion of the planographic printing plate material.

The present invention can provide a planographic printing plate material exhibiting high sensitivity and high printing durability.

The present invention will be further detailed below.

The reaction rate constant with the semiquinone radical, as described above, refers to the reaction rate constant of electron transfer from a semiquinone radical to a polymerization initiator, when the polymerization initiator is allowed to react with the semiquinone radical anion, which serves an electron donor. It is possible to determine the above reaction rate constant employing the methods described in J. Am. Chem. Soc., 1998, 120, 9220-9227, as well as Eur. J. Inorg. Chem., 2000-1557-1562. More specifically, it refers to the value determined employing the measurement method described below.

(Measurement Method of Reaction Rate Constant of Electron Transfer)

(1) Synthesis of Semiquinone Radical Anions (1-1) Dissolved in 5 ml of acetonitrile are 5.5 mg (0.05 millimole) of hydroquinone and 5.4 mg (0.05 millimole) of benzoquinone, and dissolved oxygen into the resulting solution is removed via bubbling argon gas for three minutes.

(1-2) While sealed in argon gas, 0.259 mμl (millimicroliter) (0.1 millimole) of 10 weight percent tetrabutylammonium hydroxide methanol solution, prepared under argon gas, is added to the above solution containing hydroquinone and benzoquinone.

(1-3) Based on the reaction of the following formula, obtained is a 20 millimole/liter yellowish brown acetonitrile solution of semiquinone radical anions.

The maximum absorption wavelength of semiquinone radical anions is 450 nm, while their molar absorption coefficient is 6,000.

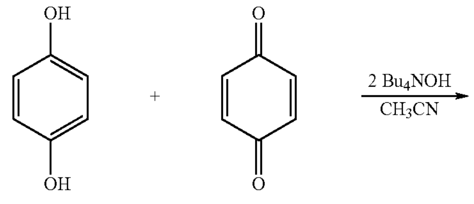

hydroquinone benzoquinone

-continued

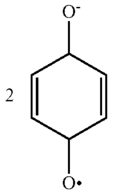

semiquinone radical (2) Electron Transfer from Semiquinone Radical Anions to the Polymerization Initiators According to the Present Invention (2-1) An acetonitrile solution containing 0.2 millimole of the polymerization initiator sample according to the present invention is prepared. To measure UV spectra, the resulting solution is sealed in a 1 cm sealable quartz cell into which a magnetic stirring rod is placed. Subsequently, dissolved oxygen in the solution is removed via bubbled argon gas for three minutes.

(2-2) The quartz cell in which the above sample solution is placed is mounted on a spectrophotometer provided with a magnetic stirrer. While stirring, 30 μl of an acetonitrile solution of 20 millimole/liter of semiquinone radical anions, prepared in (1), is injected into the quartz cell employing a gas-tight syringe.

(2-3) Immediately after the injection, electron transfer is initiated from semiquinone radical anions to the compounds of the present invention.

Time when the semiquinone radical anion solution is injected, is taken as the initiation time, and absorbance at 450 nm is determined over the elapse of time.

Along with the progress of the electron transfer reaction, semiquinone radicals are converted to benzoquinone, resulting in a decrease in the absorbance. Time when no variation of the absorbance results is taken as the termination point of the reaction.

(3) Calculation of Reaction Rate Constant (3-1) Difference in the absorbance at 450 nm between the initiation and the termination of the reaction is obtained and regarded as absorbance of the semiquinone radical anions. The absorbance of the semiquinone radical anions is divided by a molar absorption coefficient of 6,000, and the mol concentration of semiquinone radical anions is thereby calculated.

(3-2) Time (in seconds) is plotted on the abscissa, while the reciprocal number of mol concentration of semiquinone radical anions is plotted on the ordinate, whereby the variation of the absorbance with the time is plotted.

(3-3) The slope of the straight line portion of the resulting plot is determined and designated as the reaction rate constant (in $mol^{-1} \cdot l \cdot s^{-1}$).

Polymerization initiators according to the present invention are compounds of an electron transfer reaction rate constant of $200\text{-}1.0\times10^8$ of an electron transfer from semiquinone radical anions to the polymerizations initiators, when allowed to react with the semiquinone radical anions as an electron donor. Other than these, the structures are not particularly limited. Listed as preferable examples may be halogen compounds having carbon-halogen bond(s) as well as porphyrin metal complex compounds.

It was found that a photopolymerization initiator exhibiting a predetermined amount of electron accepting property produces a photopolymer of high sensitivity. It was considered that the photopolymerization initiator would act as an electron acceptor in the course of a photo reaction. An electron accepting property of the photopolymerization initiator can be quantitatively evaluated by measuring an electron transfer reaction rate with a specific electron donor compound. In this invention, a semiquinone radical anion was selected as a specific electron donor compound. When the photopolymerization initiator has an electron transfer reaction rate with a semiquinone radical anion of not less than 200, an obtained photopolymer exhibits high sensitivity. While an electron transfer reaction rate is larger than $1.0\times10^{-8}$, storage stability of the photopolymerization initiator is found to be decreased.

Of halogen compounds having carbon-halogen bond(s), preferred are those having a plurality of carbon-halogen bonds in the molecule, and compounds, which have chlorine and bromine as a halogen, are preferably employed.

Porphyrin metal complex compounds, as described herein, refer to metal complexes of the compounds having a porphyrin skeleton.

Specific examples of these compounds and reaction rate constants of the electron transfer from semiquinone radical anions to the compounds of the present invention are listed below.

TABLE 1

| No. | Structure of Polymerization Initiator | Reaction Rate Constant of Electron Transfer from Semiquinone Radical Anions |
|---|---|---|
| H-1 | *1 | 900 |
| H-2 | *2 | 900 |
| H-3 | *3 | 700 |
| H-4 | *4 | 600 |
| H-5 | *5 | 600 |
| H-6 | *6 | 250 |
| P-1 | *7 | $1.3 \times 10^4$ |
| P-2 | *8 | $8.6 \times 10^4$ |
| P-3 | *9 | $2.0 \times 10^5$ |
| P-4 | *10 | $5.8 \times 10^6$ |
| P-5 | *11 | $5.4 \times 10^7$ |

*1

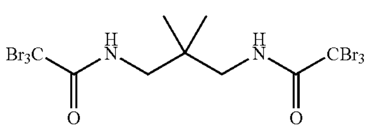

*2

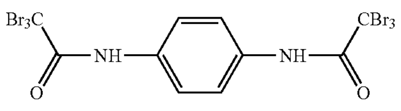

*3

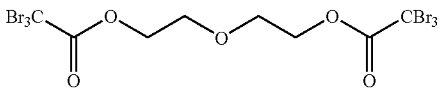

TABLE 1-continued

| No. | Structure of Polymerization Initiator | Reaction Rate Constant of Electron Transfer from Semiquinone Radical Anions |
|---|---|---|

*4

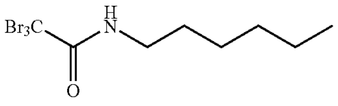

*5

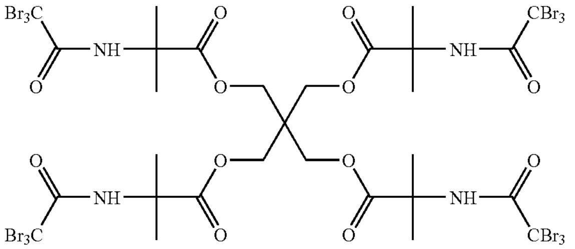

*6

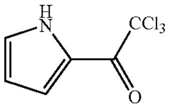

*7

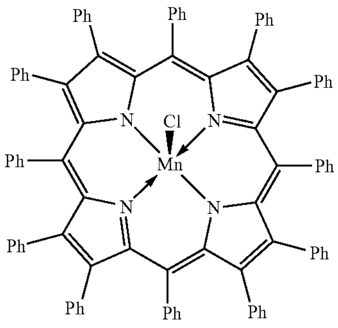

*8

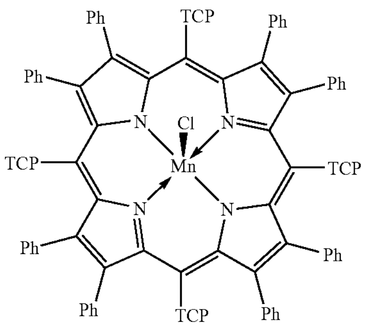

TCP: 2,3,5-trichlorophenol

TABLE 1-continued

| No. | Structure of Polymerization Initiator | Reaction Rate Constant of Electron Transfer from Semiquinone Radical Anions |
|---|---|---|
| *9 | 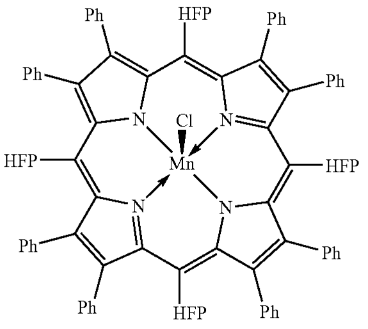 PFP: 2,3,4,5,6-pentafluorophenyl | |
| *10 | 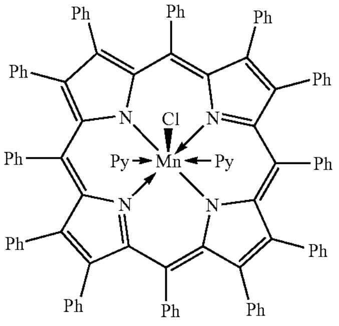 Py: pyridyl | |
| *11 | 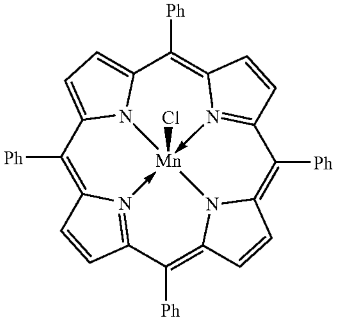 | |

The used amount of polymerization initiators according to the present invention is preferably in the range of 0.01-30 percent by weight with respect to the total weight of non-volatile components of the light-sensitive compositions, but is most preferably in the range of 0.5-20 percent by weight.

(Other Polymerization Initiators)

Light-sensitive compositions employed in the present invention may incorporate other polymerization initiators together with the polymerization initiators according to the present invention.

Examples of usable polymerization initiators include compounds capable of forming radicals described in Japanese Patent Publication to Public Inspection (under PCT Application) No. 2002-537419 and polymerization initiators described in JP-A Nos. 2001-175006, 2002-278057, and 2003-5363. Other than these, if described, employed may be onium salts having at least two cation portions in one molecule described in JP-A No. 2003-76010, N-nitrosoamine based compounds described in JP-A No. 2001-133966, compounds, which thermally generate radicals described in JP-A No. 2001-34374, compounds which thermally generate acids or radicals described in JP-A No. 2002-6482, borate compounds described in JP-A No. 2002-116539, compounds which thermally generate acids or radicals described in JP-A No. 2002-148790, optical or thermal polymerization initiators having a polymerizable unsaturated group described in JP-A No. 2002-207293, onium salts having a divalent or higher valent anion as paired ions described in JP-A No. 2002-268217, specifically structured sulfonylsulfone compounds described in JP-A No. 2002-328465, compounds which thermally generate radicals described in JP-A No. 2002-341519, iron arene complex compounds described in JP-A No. 59-219307, and hexaarylbisimidazole described in JP-A No. 2003-295426.

The following are preferably listed as examples of a second polymerization initiator which can be used in combination with a first polymerization initiator contained in the photosensitive composition of the present invention.

Listed examples are: a triaryl sulfonium compound, a diaryl iodonium compound, a trihalomethyltriazine compound, an acylphosphine oxide compound, a benzoin derivative, and an N-phenylglycine derivative, a titanocene compound, a hexaaryl bisimidazole compound, and an iron arene complex compound.

A titanocene compound is listed as a particularly preferable second polymerization initiator used in combination with a first polymerization initiator.

The following are listed as examples of titanocenes: Di-cyclopentadienyl-Ti-di-chloride, dicyclopentadienyl-Ti-bisphenyl, dicyclopentadienyl-Ti-bis-2,3,4,5,6-pentafluorobenzene-1-yl, dicyclopentadienyl-Ti-bis-2,3,5,6-tetrafluorobenzene-1-yl, dicyclopentadienyl-Ti-bis-2,4,6-trifluorobenzene-1-yl, dicyclopentadienyl-Ti-bis-2,6-difluorobenzene-1-yl, dicyclopentadienyl-Ti-bis-2,4-difluorobenzene-1-yl, di-methylcyclopentadienyl-Ti-bis-2,3,4,5,6-penta fluorobenzene-1-yl, di-methyl cyclopentadienyl-Ti-bis-2,3,5,6-tetrafluorobenzene-1-yl, di-methylcyclopentadienyl-Ti-bis-2,4-difluorobenzene-1-yl, bis(cyclopentadienyl)-bis(2,6-difluoro-3-(pyridine-1-yl) phenyl)titanium (IRUGACURE784: made in Ciba Specialty Chemicals).

Further, a hexaarylbisimidazole compound can also be listed as a preferable second polymerization initiator which can be combined with.

The manufacturing process of hexaarylbisimidazole (HABI; dimer of triarylimidazole) is described in DE1470154. The use of the compound in the photopolymerizable composition is described in EP24629, EP107792, U.S. Pat. No. 4,410,621, EP215453, and DE3211312.

Preferable derivatives thereof are as follows: 2,4,5,2',4',5'-hexaphenylbisimidazole, 2,2'-bis(2-chlorophenyl)-4,5,4',5'-tetraphenylbisimidazole, 2,2'-bis(2-bromophenyl)-4,5,4',5'-tetraphenylbis imidazole, 2,2'-bis(2,4-dichlorophenyl)-4,5,4',5'-tetraphenylbis imidazole, 2,2'-bis(2-chlorophenyl)-4,5,4',5'-tetrakis(3-methoxyphenyl)bisimidazole, 2,2'-bis(2-chlorophenyl)-4,5,4',5'-tetrakis(3,4,5-trimethoxyphenyl) bisimidazole, 2,5,2',5'-tetrakis(2-chlorophenyl)-4,4'-bis(3,4-dimethoxyphenyl)bisimidazole, 2,2'-bis(2,6-dichlorophenyl)-4,5,4',5'-tetraphenylbisimidazole, 2,2'-bis (2-nitroglycerinephenyl)-4,5,4',5'-tetraphenylbis imidazole, 2,2'-di-o-tolyl-4,5,4',5'-tetraphenyl bis imidazole, 2,2'-bis(2-ethoxyphenyl)-4,5,4',5'-tetraphenylbisimidazole and 2,2'-bis(2,6-difluorophenyl)-4,5,4',5'-tetraphenyl bis imidazole.

Another listed second polymerization initiators are iron arene compounds.

Examples of iron-arene complex are listed in JP-A No. 59-219307. Specifically preferred are, η-benzene-(η-cyclopentadienyl)iron hexafluorophosphate, η-cumene-(η-cyclopentadienyl)iron hexafluorophosphate, η-fluorene-(η-cyclopentadienyl)iron hexafluorophosphate, η-naphthalene-(η-cyclopentadienyl)iron hexafluorophosphate, η-xylene-(η-cyclopentadienyl)iron hexafluorophosphate and η-benzene-(η-cyclopentadienyl)iron tetrafluoroborate Other polymerization initiators listed are sulfonium salt compounds and iodonium salt compounds.

Specific examples of sulfonium salt compounds and iodonium salt compounds include the compounds described in JP-A Nos. 2001-343742, 2002-6482, 2002-116539, 2002-148790, 2002-268217, 2002-341519, 2003-076010, and 2003-5363.

Further, it is possible to preferably incorporate diazo resins as a photopolymerization initiator. Listed as preferred diazo resins are those described in JP-A No. 10-31307.

The added amount of simultaneously usable polymerization initiators in an image forming layer is optional. It is preferably in the range of 0.1-20 percent by weight in photosensitive compositions, but is more preferably in the range of 0.8-15 percent by weight.

Preferred embodiments are such that polymerization initiators, described as above, are simultaneously employed in the light-sensitive compositions of the present invention.

Namely, preferred embodiments include the light-sensitive compositions described in the aforesaid claims 1-3, wherein in addition to aforesaid polymerization initiator (B), titanocene compounds are incorporated as a polymerization initiator, the light-sensitive compositions described in the aforesaid claims 1-3, wherein, in addition to aforesaid polymerization initiator (B), hexaarylbisimidazole compounds are incorporated as a polymerization initiator, the light-sensitive compositions described in aforesaid claims 1-3, wherein in addition to aforesaid polymerization initiator (B), iron arene compounds are incorporated as a polymerization initiator, and the light-sensitive compositions described in aforesaid claims 1-3, wherein in addition to aforesaid polymerization initiator (B), at least one of the compounds, selected from triarylsulfonium salt compounds and diaryliodonium salt compounds, is incorporated as the polymerization initiator.

(Sensitizing Dyes)

The sensitizing dyes according to the present invention are dyes having a maximum adsorption wavelength near the wavelength of light used as an exposure light source.

As a light source, a laser having wavelengths in the range of from visible to near-infrared region is preferably listed.

As a compound corresponding to the laser and capable of sensitizing from visible to near-infrared region, the following can be listed as examples: Cyanine, phthalocyanine, merocyanine, porphyrin, Spiro compound, ferrocene, fluorene, fulgide, imidazole, perylene, phenazine, phenothiazine, polyene, azo compound, diphenylmethane, triphenylmethane, polymethineacridine, coumarin, ketocoumarin, quinacridone, indigo, styryl, pyrylium compound, pyrromethene compound, pyrazolotriazole compound, benzothiazole compound, barbituric acid derivative, thiobarbituric acid derivative and ketoalcohol borate complex.

Furthermore, compounds disclosed in European patent No. 568,993, U.S. Pat. Nos. 4,508,811, 5,227,227, JP-A Nos. 2001-125255, 11-271969 can also be used.

Specific examples of combinations of the above polymerization initiators and sensitizing dyes include combinations described in JP-A No. 11-271969.

When as a recording light source, violet lasers or ultraviolet lasers, which have been widely used in recent years, are employed, dyes are preferred which exhibit absorption in the wavelength region of the light emitted by those lasers. Specifically, dyes are preferred which exhibit a maximum absorption between 350 nm and 450 nm, but those are more preferred which exhibit a maximum absorption between 350 and 420 nm.

Structures of dyes are not particularly limited. Listed as dyes are optical brightening dyes described in JP-A No. 2003-295426, sensitizing dyes of JP-A No. 2003-21901, compounds having the structures represented by General Formula (I) of JP-A No. 2003-21895, compounds having the structures represented by General Formula (I) of JP-A No. 21894, sensitizing dyes having the specified structures of JA-A No. 2002-351072, sensitizing dyes having the specified structures of JP-A No. 2002-351071, sensitizing dyes having specified structures (being a pyrrolopyrrole ring) of JP-A No. 2002-351065, sensitizing dyes of JP-A No. 2002-268239, sensitizing dyes of JP-A No. 2002-268238, sensitizing dyes of JP-A No. 2002-268204, compounds having the structures represented by General Formula (I) of JP-A No. 2002-221790, compounds having structures represented by General Formula (I) of JP-A No. 2002-202598, carbazole based sensitizing dyes of JP-A No. 2001-042524, sensitizing dyes of JP-A No. 2000-309724, sensitizing dyes of JP-A No. 2000-258910, naphtho[1,8-bc]furan-5-one derivatives of JP-A No. 2000-206690, merocyanine based dyes of JP-A No. 2000-147763, and carbonyl compounds of JP-A No. 2000-098605.

In addition, listed as preferred examples of sensitizing dyes are coumarin compounds as shown in Dyes1-8, merocyanine dyes as shown in Dyes 9-11, boron compounds as shown in Dyes 12-14, pyrylium salt compounds as shown in Dyes 17-18, and cyanine dyes as shown in Dyes 19-24. Incidentally, usable sensitizing dyes are not limited thereto.

Dye01

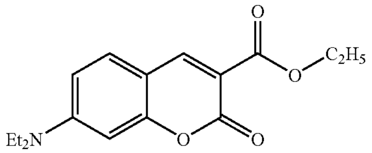

Dye02

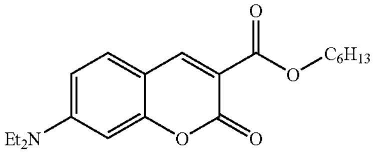

Dye03

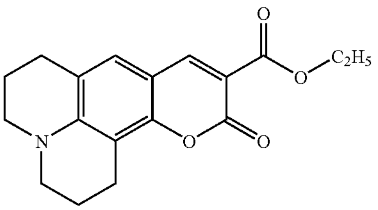

-continued
Dye04
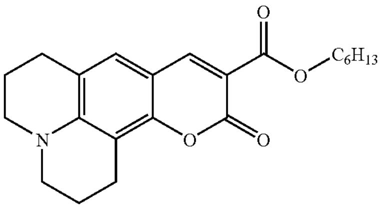
Dye05
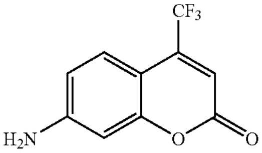
Dye06
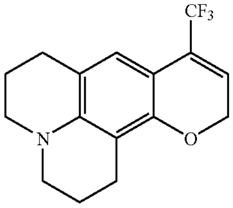
Dye07
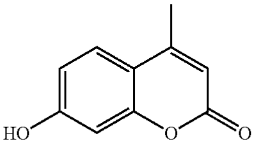
Dye08
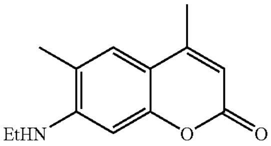
Dye09
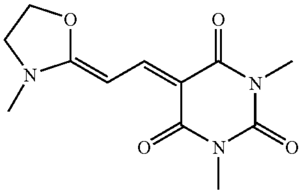
Dye10
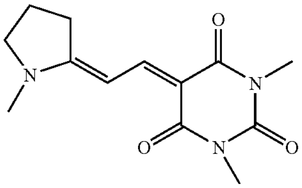
Dye11
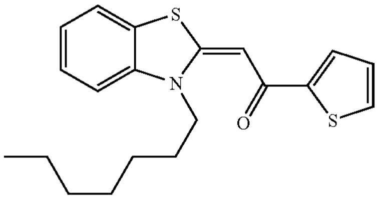
-continued
Dye12
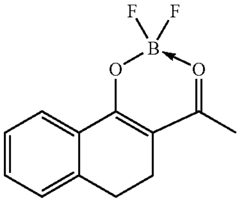
Dye13
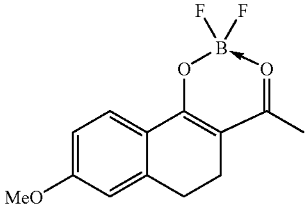
Dye14
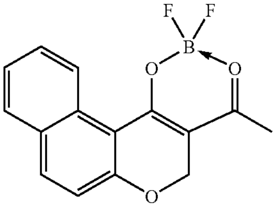
Dye15
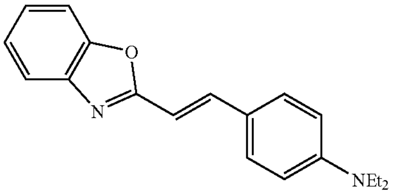
Dye16
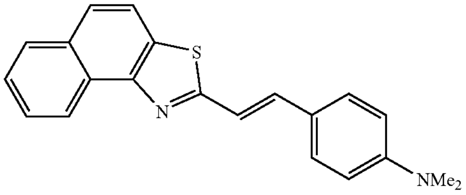
Dye17
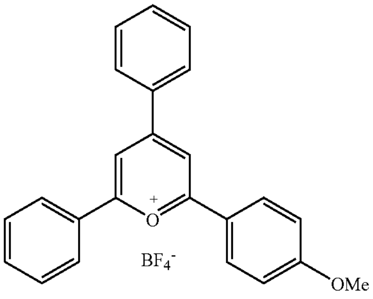

-continued

Dye18

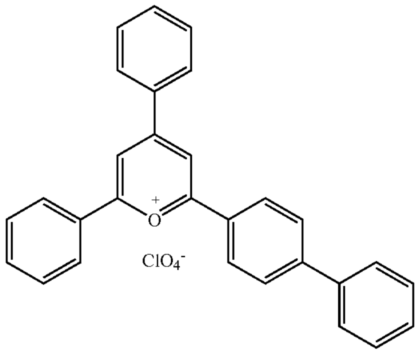

Dye09

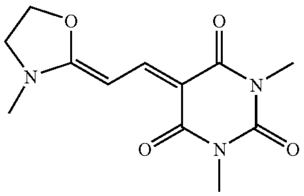

Dye10

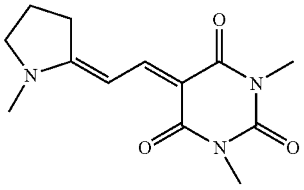

Dye11

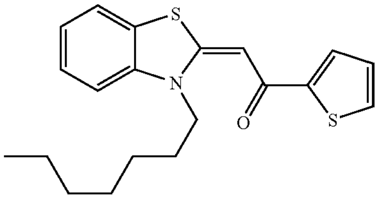

Dye12

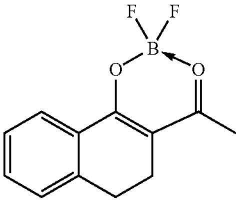

Dye13

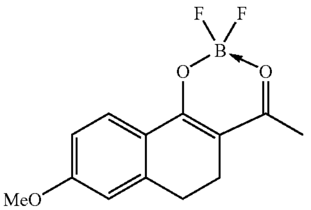

Dye14

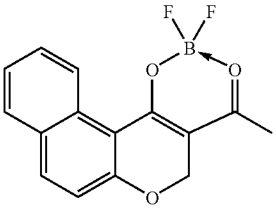

-continued

Dye15

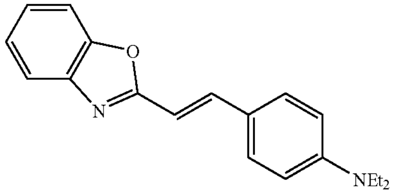

Dye16

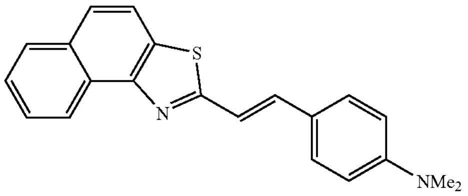

Dye17

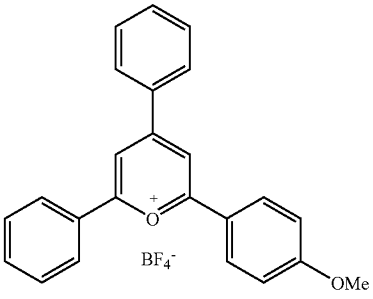

Dye18

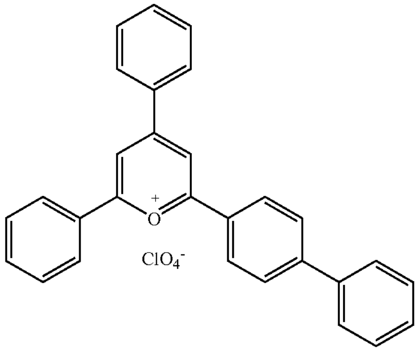

Further, when near infrared lasers which have achieved high output are employed as a recording light source, dyes are preferred which exhibit absorption in the wavelength region for emitted light.

Specifically, preferred dyes are those which exhibit a maximum absorption between 700 and 1,100 nm, but more preferred dyes are which exhibit absorption between 750 and 900 nm. Listed as dyes corresponding to near infrared laser beam sources are, for example, cyanine dyes as well as squarylium dyes. In view of ease of synthesis and cost concerns, particularly preferred are cyanine dyes. Specific examples of cyanine dyes include those described in JP-A No. 2003-76010.

The content of sensitizing dyes in light-sensitive compositions is optional in cases corresponding to any of the light sources. However, the content is preferably in the range of 0.1-20 percent by weight in the light-sensitive compositions.

The above content is more preferably 0.8-15 percent by weight. In more detail, when applied to light-sensitive layer of light-sensitive lithographic plate materials, the added amount is preferable that which results in absorbance of reflection spectra employing an integrating sphere in the range of 0.2-2.0. The added amount is more preferable one which results in an absorbance of 0.3-1.2.

These sensitizing dyes can be used solely or in combination thereof.

(Ethylenically Unsaturated Compound)

The ethylenically unsaturated compound in the invention is a compound having a ethylenically unsaturated group in the compound and is capable of polymerizing.

Suitably used examples for the present invention are, generally known radical polymerization monomers, polyfunctional monomers having an ethylenic double bond capable of addition polymerization used for common UV curing resins, or poly-functional oligomers.

The ethylenically unsaturated compounds are not specifically limited, however, preferred examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate, an ester of 1,3-dioxane-ϵ-caprolactone adduct with acrylic acid, or 1,3-dioxolane acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ϵ-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ϵ-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ϵ-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

Further, a prepolymer can also be used as the above-described monomers. Examples of prepolymers are listed below. It can be preferably used prepolymers prepared from oligomers having an appropriate molecular weight by introducing an acrylic group or a methacrylic group in the molecule to yield a photopolymerization property.

The prepolymer may be used solely or may be used in combination of two or more, and the prepolymer may be used in combination of the above-described monomers or oligomers.

Examples of the prepolymer include polyester(meth)acrylate obtained by incorporating (meth)acrylic acid in a polyester of a polybasic acid such as adipic acid, trimellitic acid, maleic acid, phthalic acid, terephthalic acid, himic acid, malonic acid, succinic acid, glutaric acid, itaconic acid, pyromellitic acid, fumaric acid, pimelic acid, sebacic acid, dodecanoic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, glycerin, trimethylol propane, pentaerythritol, sorbitol, 1,6-hexanediol or 1,2,6-hexanetriol; an epoxyacrylate such as bisphenol A.epichlorhydrin.(meth)acrylic acid or phenol novolak.epichlorhydrin.(meth)acrylic acid obtained by incorporating (meth) acrylic acid in an epoxy resin; an urethaneacrylate such as ethylene glycol.adipic acid.tolylenediisocyanate.2-hydroxyethylacrylate, polyethylene glycol.tolylenediisocyanate.2-hydroxyethylacrylate, hydroxyethylphthalyl methacrylate.xylenediisocyanate, 1,2-polybutadieneglycol.tolylenediisocyanate.2-hydroxyethylacrylate or trimethylolpropane.propylene glycol.tolylenediisocyanate.2-hydroxyethylacrylate, obtained by incorporating (meth)acrylic acid in an urethane resin; a silicone acrylate such as polysiloxane acrylate, or polysiloxane.diisocyanate.2-hydroxyethylacrylate; an alkyd modified acrylate obtained by incorporating a methacroyl group in an oil modified alkyd resin; and a spiran resin acrylate.

The light sensitive composition or light sensitive layer of the planographic printing plate material of the invention may contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

The ethylenically unsaturated compound used in the invention is a phosphate compound having at least one (meth)acryloyl group. The phosphate compound is a compound having a (meth)acryloyl group in which at least one hydroxyl group of phosphoric acid is esterified. The ethylenically unsaturated compound used in the invention is not limited, as long as it has a (meth)acryloyl group.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV.EB Koka Handbook (Materials)" edited by Kobunshi Kankokai can be suitably used. Of these compounds, compounds having two or more acryl or methacryl groups in the molecule are preferable, and those having a molecular weight of not more than 10,000, and those having a molecular weight of not more than 5,000 are more preferable.

In the present invention, it is preferable to use a polymerizable compound having an ethylenically unsaturated bond and containing a tertiary amino group in the molecule. The structure of the preferred compound is not specifically limited, however, preferred compounds are tertiary amino compounds having a hydroxyl group modified with glycidyl methacrylate, methacryloyl chloride or acryloyl chloride. More specifically, the compounds disclosed in JP-A Nos. 1-165613, 1-203413 and 1-197213 may be preferably used.

Further, in the present invention, it is preferably used such as a polyalcohol having a tertiary amino group in the molecule, a diisocyanate compound, a reaction product of a polymerizable compound having an ethylenically unsaturated bond and a hydroxyl group in the molecule. Specifically preferable compound is a compound having a tertiary amino group and an amido bond.

As polyalcohols containing a tertiary amino group in the molecule, the followings are cited.

Triethanolamine, N-methyldiethanolamine, N-ethyl diethanolamine, N-n-butyl diethanolamine, N-tert-butyl diethanolamine, N,N-di(hydroxyethyl)aniline, N,N,N',N'-tetra-2-hydroxypropylethylenediamine, p-tolyl diethanolamine, and N,N,N',N'-tetra-2-hydroxyethyl ethylenediamine, N,N-bis(2-hydroxypropyl)aniline, aryl diethanolamine, 3-(dimethylamino)-1,2-propanediol, 3-diethyl amino-1,2-propanediol, N,N-di(n-propyl)amino-2,3-propanediol, N,N-di(iso-propyl)amino-2,3-propanediol, and 3-(N-methyl-N-benzylamino)-1,2-propanediol.

The present invention is not limited to these.

The following are cited as diisocyanate compounds.

Butane-1,4-diisocyanate, hexane-1,6-diisocyanate, 2-methylpentane-1,5-diisocyanate, octane-1,8-diisocyanate, 1,3-diisocyanatemethyl-ketohexamethylene, 2 and 2,4-trimethyl hexane-1,6-diisocyanate, isophoronediisocyanate, 1,2-phenylenediisocyanate, 1,3-phenylenediisocyanate, 1,4-phenylenediisocyanate, tolylene-2,4-diisocyanate, tolylene-2,5-diisocyanate, tolylene-2,6-diisocyanate, 1,3-di(isocyanatomethyl)benzene,and 1,3-bis(1-isocyanato-1-methyl ethyl)benzene.

The present invention is not limited to these.

Although MH-1 to MH-13 are cited as compounds having a hydroxyl group and an ethylenic double bond capable of addition polymerization in the molecule, it is not limited to these.

Preferably cited are, 2-hydroxyethyl methacrylate, 2-hydroxyethyl acrylate, 4-hydroxybutyl acrylate, 2-hydroxypropylene-1,3-dimethacrylate, and 2-hydroxypropylene-1-methacrylate-3-acrylate.

These reactions are reactions between a diol compound, a diisocyanate compound, and an acrylate compound containing a hydroxyl group, and can be performed like the way of preparing an urethane acrylate.

Examples of reaction products between polyalcohol containing a tertiary amino group in the molecule, a diisocyanate compound, and a compound containing the ethylene nature double bond and a hydroxyl group capable of polymerization are shown below.

(Synthetic Examples of Multifunctional Oligomers)

M-1: The reaction product of triethanolamine (one mol), hexane-1,6-diisocyanate (three mols), and 2-hydroxyethyl methacrylate (three mols)

M-2: The reaction product of triethanolamine (one mol), isophorone diisocyanate (three mols), and 2-hydroxyethyl acrylate (three mols)

M-3: The reaction product of N-n-butyldiethanolamine (one mol), 1,3-bis(1-isocyanato-1-methylethyl)benzene (two mols), and 2-hydroxy propylene-1-methacrylate-3-acrylate (two mols)

M-4: The reaction product of N-n-butyldiethanolamine (one mol), 1,3-di(isocyanatomethyl)benzene (two mols), and 2-hydroxypropylene-1-methacrylate-3-acrylate (two mols)

M-5: The reaction product of N-methyldiethanolamine (one mol), tolylene-2,4-diisocyanate (two mols) and 2-hydroxy propylene-1, and 3-dimethacrylate (two mols)

M-6: The reaction products of triethanolamine (one mol), 1,3-bis(1-isocyanato-1-methylethyl)benzene (three mols) and 2-hydroxyethyl methacrylate (three mols)

M-7: The reaction product of ethylenediaminetetraethanol (one mol), 1,3-bis (1-isocyanato-1-methylethyl)benzene (four mols) and 2-hydroxyethyl methacrylate (four mols)

In addition, acrylate or alkyl acrylate described in JP-A Nos. 1-105238 and 2-127404 can be used.

(Polymer Binder)

A polymer binder used in the present invention is capable of holding elements in the photosensitive layer of the planographic printing material.

Listed examples of the polymer binders are, an acrylic polymer, polyvinyl butyral resin, polyurethane resin, polyamide resin, polyester resin, epoxy resin, phenol resin, polycarbonate, polyvinyl butyral resin, polyvinyl formal resin, shellac and other known natural resin. The combination of two or more may be used.

Among them, particularly preferred for the present invention is an alkali soluble polymer.

In the invention, the alkali soluble polymer refers to a polymer having an acid value and is preferably a copolymer having various structures described later.

As the copolymer, a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin is preferably used. These resins can be used as an admixture of two or more thereof.

Of these, polymers having a hydroxyl group or a carboxyl group are preferably used, and polymers having a carboxyl group are more preferably used.

Of these, a vinyl copolymer is preferably used which is obtained by copolymerization of an acryl monomer, and more preferred is a copolymer containing (a) a carboxyl group-containing monomer unit and (b) an alkyl(meth) acrylate unit as the copolymerization component.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate and alkyl acrylate include an unsubstituted alkyl ester such as: methyl methacrylate, ethyl methacrylate, propyl methacrylate, butyl methacrylate, amyl methacrylate, hexyl methacrylate, heptyl methacrylate, octyl methacrylate, nonyl methacrylate, decyl methacrylate, undecyl methacrylate, or dodecyl methacrylate; and methyl methacrylate, ethyl methacrylate, propyl methacrylate, butyl methacrylate, amyl methacrylate, hexyl methacrylate, heptyl methacrylate, octyl methacrylate, nonyl methacrylate, decyl methacrylate, undecyl methacrylate, or dodecyl methacrylate, a cyclic alkyl ester such as: cyclohexyl methacrylate or cyclohexyl acrylate, and a substituted alkyl ester such as: benzyl methacrylate, 2-chloroethyl methacrylate, N,N-dimethylaminoethyl methacrylate, or glycidyl methacrylate, benzyl acrylate, 2-chloroethyl acrylate, N,N-dimethylaminoethyl acrylate, or glycidyl methacrylate.

As another monomer unit, a monomer unit derived from the monomer described in the following items (1) through (14) can be used.

(1) A monomer having an aromatic hydroxy group, for example, (o-, p- or m-)hydroxystyrene, or (o-, p- or m-) hydroxyphenylacrylate;

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

(3) A monomer having an aminosulfonyl group, for example, m- or p-aminosulfonylphenyl methacrylate, m- or p-aminosulfonylphenyl acrylate, N-(p-aminosulfonylphenyl) methacrylamide, or N-(p-aminosulfonylphenyl)acrylamide;

(4) A monomer having a sulfonamido group, for example, N-(p-toluenesulfonyl)acrylamide, or N-(p-toluenesulfonyl)-methacrylamide;

(5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenyl-methacrylamide;

(6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl)heptadecafluorooctyl-sulfonamide;

(7) A vinyl ether, for example, ethyl vinyl ether, 2-chloroethyl vinyl ether, propyl vinyl ether, butyl vinyl ether, octyl vinyl ether, or phenyl vinyl ether;

(8) A vinyl ester, for example, vinyl acetate, vinyl chroloacetate, vinyl butyrate, or vinyl benzoate;

(9) A styrene, for example, styrene, methylstyrene, or chloromethystyrene;

(10) A vinyl ketone, for example, methyl vinyl ketone, ethyl vinyl ketone, propyl vinyl ketone, or phenyl vinyl ketone;

(11) An olefin, for example, ethylene, propylene, isobutylene, butadiene, or isoprene;

(12) N-vinylpyrrolidone, N-vinylcarbazole, or N-vinylpyridine;

(13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene; and

(14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further another monomer may be copolymerized with the above monomers.

It is possible to produce the above vinyl based polymers employing common solution polymerization. Further, it is also possible to produce them employing bulk polymerization or suspension polymerization. Polymerization initiators are not particularly limited and include azobis based radical generating agents such as 2,2'-azobisisobutylnitrile (AIBN) or 2,2'-azobis(2-methylbutyronitrile). Further, the used amount of these polymerizations initiators is commonly 0.05-10.0 parts by weight with respect to 100 parts by weight of the total monomers employed to form copolymers (preferably 0.1-5 parts by weight). Further listed as solvents employed during the solution polymerization are ketone based, ester based, and aromatic organic solvents. Of these, commonly listed are good solvents for acryl based polymers such as toluene, ethyl acetate, benzene, methyl cellosolve, ethyl cellosolve, acetone, or methyl ethyl ketone. Of these, preferred are solvents at a boiling point of 60-120° C. In the case of solution polymerization, it is common to perform the polymerization under conditions of a reaction temperature of 40-120° C. (preferably 60-110° C.), and a reaction time of 3-10 hours (preferably 5-8 hours), by employing the above solvents. After the reaction, solvents are removed to obtain copolymers. Further, without removing solvents, it is possible to subsequently conduct the double bond introducing reactions, described below.

It is possible to adjust the molecular weight of the resulting copolymers by controlling the types of used solvents well as the reaction temperature. It is possibly to appropriately choose solvents and reaction temperature used to prepare copolymers of the targeted molecular weight depending on the used monomers.

It is further possible to control the molecular weight of the resulting copolymers by mixing the specified solvents with the above solvents. For example, listed are mercaptan based solvents (e.g., n-octylmercaptan, n-dodecylmercaptan, t-dodecylmercaptan, and mercaptoethanol), carbon tetrachloride based solvents (e.g., carbon tetrachloride, butyl chloride, and propylene chloride). It is also possible to appropriately choose the mixing ratio of these solvents with the above solvents used for reactions depending on monomers and solvents used for the reaction as well as reaction conditions.

In addition, it is preferable that polymer binders according to the present invention are vinyl based polymers having a carboxyl group, as well as polymerizable double bonds on the side chain.

For example, preferred as polymer binders are unsaturated bond containing vinyl based copolymers which are obtained by allowing the carboxyl group in the molecule of the above vinyl based polymers to undergo addition reaction of the compounds having a (meth)acryloyl group as well as an epoxy group in the molecule. Specifically listed as compounds having an unsaturated bond as well as an epoxy group in the molecule are glycidyl acrylate and glycidyl methacrylate, as well as epoxy groups containing unsaturated compounds described in JP-A No. 11-271969.

Further, the above polymer binders may also be prepared in such a manner that hydroxyl groups in the above vinyl based polymers undergo addition reaction with compounds having a (meth)acryloyl group as well as an isocyanate group in the molecule. Also preferred as polymer binders are unsaturated bond containing vinyl based copolymers. Preferably listed as compounds having an unsaturated bond as well as an isocyanate group in the molecule are vinyl isocyanate, (meth)acryl isocyanate, 2-(meth)acroyloxyethyl isocyanate, m- or p-isopropenyl-α,α'-dimethylbenzyl isocyanate. Also listed may be (meth)acryl isocyanate, as well as 2-(meth)acryloyloxyethyl isocyanate.

It is possible to perform the addition reaction of the carboxyl group in the molecule of vinyl based copolymers with compounds having a (meth)acryloyl group as well as an epoxy group in the molecule employing methods known in the art. Reaction may be performed in such a manner that, for example, the reaction temperatures is commonly 20-100° C., is preferably 40-80° C., but is most preferably lower than or equal to the boiling point (under refluxing) of the used solvents, while reactions time is commonly 2-10 hours, but is preferably 3-6 hours.

The solvents used in the polymerization reaction of the above vinyl system copolymer are listed as examples of the solvents to be used. After the completion of the polymerization, the used solvent can be used without removing for the next reaction to introduce an unsaturated compound having an alicyclic epoxy group. The reaction can be performed under existence of a catalyst or a polymerization inhibitor if needed. Here, as a catalyst, an amine compound and an ammonium chloride compound are preferable.

The following can be listed as examples of an amine compound: Triethylamine, tributylamine, dimethylaminoethanol, diethylaminoethanol, methylamine, aminoethane, n-propylamine, isopropylamine, 3-methoxypropylamine, butylamine, allylamine, aminohexane, 2-ethylhexylamine, and benzylamine.

Triethyl benzyl ammonium chloride is listed as an example of an ammonium chloride compound. When the above-described compounds are used as a catalyst, the amount of the compound to be added is form 0.01-20.0 wt % of the unsaturated compound having an alicyclic epoxy group used in the reaction.

As polymerization inhibitors, a hydroquinone, hydroquinone monomethyl ether, 2,6-di-tert-butyl-4-methylphenol are listed. The amount used is 0.01-5.0 wt % of the unsaturated compound having an alicyclic epoxy group used in the reaction.

The progress of the reaction can be checked by measuring the acid value of the reaction system. The reaction is stopped when the acid value becomes 0.

It is possible to perform the addition reaction of a hydroxyl group in the molecule of vinyl based polymers with compounds having a (meth)acryloyl group as well as an isocyanate group in the molecule, employing methods known in the art. Reaction may be performed in such a manner that, for example, the reaction temperatures is commonly 20-100° C., is preferably 40-80° C., but is most preferably lower than or equal to the boiling point (during refluxing) of the used solvents, while reaction time is commonly 2-10 hours, but is preferably 3-6 hours. Listed as used solvents are those which are used in the polymerization reaction of the aforementioned copolymers. Further, after the polymerization reaction, and without removing the solvents, it is possible to use the above solvents for the reaction to introduce isocyanate group containing unsaturated compounds. Further, if desired, it is possible to perform the reaction in the presence of catalysts as well as polymerization inhibitors. Herein, preferred as catalysts are tin based or amine based compounds, specific examples of which include dibutyl tin laurate and triethylamine. It is preferable that catalysts are added in an amount of 0.01-20.0 percent by weight with respect to used compounds having a double bond. Further listed as polymerization inhibitors are hydroquinone, hydroquinone monomethyl ether, and 2,6-t-butyl-4-methylphenol. The used amount is customarily 0.01-5.0 percent by weight with respect to the used unsaturated compounds having an isocyanate group. Incidentally, the progress of the reaction is monitored by determining the presence of an isocyanato group in the reaction system, while measuring the infrared absorption spectra (IR) and when no absorption is evident, the reaction may be terminated.

The amount of the above vinyl based polymers having an carboxyl group as well as a polymerizable double bond on the side chain is preferably 50-100 percent by weight with respect to the total polymer binding agents, but is more preferably 100 percent by weight.

The amount of polymer binding agents in a light-sensitive composition which is formed as a light-sensitive layer upon being coated is preferably in the range of 10-90 percent by weight, is more preferably in the range of 15-70 percent by weight, but is most preferably in the range of 20-50 percent by weight in view of the resulting increase in photographic speed.

(Various Additives)

In order to inhibit unnecessary polymerization of polymerizable ethylenic unsaturated double bond monomers during production or storage of light-sensitive lithographic printing plate materials, added to light-sensitive compositions as well as a light-sensitive layer according to the present invention, in addition to the above-mentioned components, may be polymerization inhibitors such as hindered phenol based compounds or hindered amine based compounds.

The following can be listed as examples of a hindered-phenol compound: 2,6-di-t-butyl-p-cresol, butylatedhydroxyanisole, 2,2'-methylenebis(4-methyl-6-t-butylphenol), 4,4'-butylidenebis(3-methyl-6-t-butylphenol), tetrakis-[methylene-3-(3',5'-di-t-butyl-4'-hydroxyphenyl)propionate] methane, bis[3,3'-bis-(4'-hydroxy-3'-t-butylphenyl)butyric acid]glycol ester, 2-t-butyl-6-(3-t-butyl-2-hydroxy-5-methylbenzyl)-4-methylphenyl acrylate, and 2-[1-(2-hydroxy-3,5-di-t-pentylphenyl)ethyl]-4,6-di-t-pentyl phenyl acrylate.

Preferably listed are (meth)acrylates such as, 2-t-butyl-6-(3-t-butyl-2-hydroxy-5-methylbenzyl)-4-methylphenyl (meth)acrylate, 2-[1-(2-hydroxy-3,5-di-t-pentylphenyl) ethyl]-4,6-di-t-pentylphenyl(meth)acrylate.

Listed examples of a hindered amine compound are as follows: Bis(1,2,2,6,6-pentamethyl-4-piperidyl)sebacate, Bis(2,2,6,6-tetramethyl-4-piperidyl)sebacate, 1-[2-[3-(3,5-di-t-butylhydroxyphenyl)propionyloxy]ethyl]-4-[3-(3,5-di-t-butyl-4-hydroxyphenyl)propionyloxy]-2,2,6,6-tetramethylpiperidine, 4-benzoyloxy-2,2,6,6-tetramethylpiperidine, 8-acetyl-3-dodecyl-7,7,9,9-tetramethyl-1,3,8-triazaspiro [4.5]decane-2,4-dion.

The following can be listed as other polymerization inhibitors: Hydroquinone, p-methoxyphenol, di-t-butyl-p-cresol, pyrogallol, t-butylcatechol, benzoquinone, 4,4'-thiobis(3-methyl-6-t-butylphenol), 2,2'-methylene bis(4-methyl-6-t-butylphenol), cerium(III) salt of N-nitroso phenylhydroxylamine, and hindered amine (e.g., 2,2,6,6,-tetramethylpiperidine derivative)

The added amount of polymerization inhibitors is preferably about 0.01-—about 5 percent by weight with respect to the weight of the total solids of the above compositions. Further, if desired, in order to minimize polymerization inhibition due to oxygen, behenic acid or higher fatty acid derivatives such as behenic acid amide may be added or localized onto the surface of the light-sensitive layer during the drying process after coating. The added amount of higher fatty acid derivatives is preferably about 0.5-10 percent by weight with respect to the total composition.

Further, it is possible to use colorants. Suitably employed as colorants may be those known in the art including commercially available products. Listed as examples may be those described in the newly revised edition, "Senryo Binran (Pigments Handbook)", edited by Nippon Ganryo Gijutsu Kyokai (Seibundo Shinkosha) and Color Index Binran (Color Index Handbook).

Listed as types of pigments are black pigments, yellow pigments, red pigments, brown pigments, violet pigments, blue pigments, green pigments, fluorescent pigments, and metal powder pigments. Specific examples include inorganic pigments (titanium oxide, carbon black, graphite, zinc oxide, Prussian Blue, cadmium sulfide, iron oxide, as well as chromates of lead, zinc, barium and calcium), in addition to organic pigments (azo based, thioindigo based, anthraquinone based, anthoanthrone based, triphenoxazine based pigments, bat dye pigments, phthalocyanine pigments and derivatives thereof, and quinacridone pigments).

Of these, it is preferable to select and use pigments which have substantially no absorption in the absorption wavelength region of spectral sensitizing dyes corresponding to the laser beam used for exposure. In such cases, the reflection absorption of pigments is preferably at most 0.05 which is determined at the wavelength of the used laser beam, employing an integrating sphere. Further, the added amount of pigments is preferably 0.1-10 percent by weight with respect to the solids of the above compositions, but is more preferably 0.1-5 percent by weight.

Further, it is possible to incorporate into the light-sensitive composition of the present invention, surface active agents as a coatability improving agent within a range amount which does not adversely affect the performance of the present invention. Of these, preferred are fluorine based surface active agents.

Still further, in order to improve physical properties of cured layers, added may be additives such as inorganic fillers as well as plasticizers such as dioctyl phthalate, dimethyl phthalate, and tricresyl phosphate. The added amount of these is preferably at most 10 percent with respect to the total solids.

Still further, it is preferable that the light-sensitive compositions and light-sensitive layers according to the present invention incorporate aminophenol compounds such as (2,4,6-tris(dimethylaminomethyl)phenol), as well as mercapto group containing compounds such as 2-mercaptobenzothaizole, 2-mercaptobenzoxazole, or 2-mercaptobenzodiazole.

The content of these phenols and mercapto group containing compounds is preferably 0.2-10 percent by weight, but is more preferably 0.5-5 percent by weight.

The following can be listed as a solvent used for preparing a coating mixture containing a photosensitive composition to produce a photosensitive layer of the present invention. Examples are as follows. Derivatives of alcohol and polyalcohol such as: sec-butanol, isobutanol, n-hexanol, the benzyl alcohol, diethylene glycol, the triethylene glycol, tetraethylene glycol, 1,5-pentanediol; ethers such as: propyleneglycol monobutyl ether, dipropyleneglycol monomethyl ether, and tripropylene glycol monomethyl ether; ketones and aldehydes such as: Diacetone alcohol, ketohexamethylene, methylcyclohexanone; and esters such as: ethyl lactate, butyl lactate, oxalic-acid diethyl, and methyl benzoate.

(Support)

A support of the present invention is a plate or a film which is capable of holding an photosensitive layer, and is preferably has a hydrophilic surface on which the photosensitive layer is provided.

As the supports used in the invention, a plate of a metal such as aluminum, stainless steel, chromium or nickel, or a plastic film such as a polyester film, a polyethylene film or a polypropylene film, which is deposited or laminated with the above-described metal can be used.

Further, a polyester film, a polyvinyl chloride film or a nylon film whose surface is subjected to a treatment to provide hydrophilic nature can be used. Among the above, the aluminum plate is preferably used, and may be a pure aluminum plate or an aluminum alloy plate.

As the aluminum alloy, there can be used various ones including an alloy of aluminum and a metal such as silicon, copper, manganese, magnesium, chromium, zinc, lead, bismuth, nickel, titanium, sodium or iron. The aluminum support is used after being treated surface roughening so as to give a water holding capacity.

It is preferable that the support in the invention is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting support is preferably subjected to desmut treatment in an aqueous solution of an acid such as phosphoric acid, nitric acid, sulfuric acid, chromic acid, or a mixture thereof, since smut is produced on the surface of the support. The surface roughening methods include a mechanical surface roughening method and an electrolytic surface roughening method electrolytically etching the support surface.

The mechanical surface roughening methods used for the present invention are not specifically limited, however, brush roughening and horning roughening are preferred.

The electrochemical surface roughening methods used for the present invention are also not specifically limited, however, it is preferable to carry out the electrochemical surface roughening in an acidic electrolytic solution.

After carrying out the surface roughening treatment with an electrochemical surface roughening method, it is preferable to immerse the support in an acidic or basic solution so as to eliminate waste aluminum materials remained on the surface of the support. Listed examples of acids are, sulfuric acid, persulphuric acid, hydrofluoric acid, phosphoric acid, nitric acid and hydrochloric acid. Listed examples of bases are, sodium hydroxide and potassium hydroxide. Among them, an alkali aqueous solution is preferred. An amount of aluminum to be dissolved is preferably, from 0.5 to 5 $g/m^2$. After the immersion treatment in an alkali solution, it is preferable to neutralize the alkali with an acid such as phosphoric acid, nitric acid, sulfuric acid, chromic acid or the mixed acid thereof.

The mechanical surface roughening methods and the electrochemical surface roughening methods may be employed solely or it may be combined: at first, carry out a mechanical surface roughening method; and then carry out a electrochemical surface roughening method.

After surface roughening treatment, it may be applied anode oxidation treatment. The anode oxidation methods used for the present invention are not specifically limited. Usually known anode oxidation methods may be employed. By carrying out the anode oxidation treatment, an oxidized coating is formed on the support.

The support having been subjected to anode oxidation treatment may be further subjected to sealing treatment when required. The sealing treatment may be carried out using the methods such as hot water treatment, boiling water treatment, vapor treatment, sodium silicate treatment, bichromate salt aqueous solution treatment, nitrite salt treatment and ammonium acetate treatment.

Further, after above-described treatments, it is preferably carry out under coat treatment with a water soluble resin (e.g., a polymer or a copolymer having a polyvinylphosphinic acid group or a sulphonic acid group in the side chain), polyacrylic acid, a water soluble metallic salt (e.g., zinc borate), a yellow dye or a amine salt. Still further, sol-gel treatment described in JP-A No. 5-304358, which forms a covalent bond between a functional group and a radical by an addition reaction, is also preferably used.

In the invention, a planographic printing plate material can be obtained by preparing a light sensitive composition, coating the liquid on the support according to a coating conventional method, and drying. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

The drying temperature of the coated light sensitive layer is preferably from 60 to 160° C., more preferably from 80 to 140° C., and still more preferably from 90 to 120° C.

(Protective Layer)

In the invention, a protective layer (an oxygen shielding layer) is preferably provided on the light sensitive layer. It is preferred that the protective layer is highly soluble in the developer as described later (generally an alkaline solution).

Listed examples of the compounds included in the protective layer are, polyvinyl alcohol, polysaccharide, polyvinylpyrrolidone, polyethylene glycol, gelatin, glue, casein, hydroxyethyl cellulose, carboxymethyl cellulose, methyl cellulose, hydroxyethyl starch, gum arabic, sucrose octaacetate, ammonium alginate, sodium alginate, polyvinyl amine, polyethylene oxide, polystyrene sulfonic acid, polyacrylic acid, or a water soluble polyamide and polyvinylpyrrolidone copolymer. These compounds may be used in the protective layer forming composition solely or in combination of two or more.

In order to prepare the coating composition of the protective layer, the above-listed compound is dissolved in an appropriate solvent, and then used for coating. The protective layer is coated on the photopolymerizable light sensitive layer and drying. The thickness of the protective layer is preferably 0.1 to 5.0 μm, and more preferably 0.5 to 3.0 μm. The protective layer may further contain a surfactant or a matting agent.

The coating methods for the protective layer may be suitably applied the methods listed for the above-described photosensitive layer. The drying temperature of the coated protective layer is preferably lower than that of the photosensitive layer. It is preferably 10° C. lower or more than the drying temperature of the photosensitive layer, more preferably, it is 20° C. lower or more and the upper limit is about 50° C.

The drying temperature of the coated protective layer is preferably lower than a glass transition temperature (Tg) of the binder included in the photosensitive layer. The difference between the drying temperature of the protective layer and a glass transition temperature (Tg) of the binder included in the photosensitive layer is preferably not less than 20° C., and more preferably not less than 40° C., and upper limit is about 60° C.

(Preparation Method of a Print Plate)

The photosensitive printing plate material of the present invention can be processed to obtain a printing plate.

Examples of a light source for exposing the planographic printing material are as follows: laser, LED, xenon lamp, xenon flash lamp, halogen lamp, carbon arc lamp, metal halide lamp, tungsten lamp, high pressure mercury lamp and non-electrode lamp.

It is preferably used a laser exposure, and specifically laser beam exposure, to obtain a printing plate from a photosensitive planographic printing plate material of the present invention.

As a laser scanning method by means of a laser beam, there are a method of scanning on an outer surface of a cylinder, a method of scanning on an inner surface of a cylinder and a method of scanning on a plane. In the method of scanning on an outer surface of a cylinder, laser beam exposure is conducted while a drum around which a recording material is wound is rotated, in which main scanning is represented by the rotation of the drum, while sub-scanning is represented by the movement of the laser beam.

In the method of scanning on an inner surface of a cylinder, a recording material is fixed on the inner surface of a drum, a laser beam is emitted from the inside, and main scanning is carried out in the circumferential direction by rotating a part of or an entire part of an optical system, while sub-scanning is carried out in the axial direction by moving straight a part of or an entire part of the optical system in parallel with a shaft of the drum.

In the method of scanning on a plane, main scanning by means of a laser beam is carried out through a combination of a polygon mirror, a galvanometer mirror and an Fθ lens, and sub-scanning is carried out by moving a recording medium.

The method of scanning on an outer surface of a cylinder is suitable for high density image recording, since it is easily construct an optical system and it is possible to decrease the distance between a light source and the recording material.

In the present invention, it is preferable to heat the exposed planographic printing material prior to development or during the development. This heating treatment (pre-heating) enable to achieve an improved sensitivity and improved printing durability.

When pre-heating is applied to the planographic printing material in an auto-processor to develop the material, a pre-heat roller may be used to heat the material at a predetermined range of the temperature prior to the development. Other heating methods using a ceramic heater or a heating fun may also be applicable.

An example of a pre-heating roller contains at least one pair of rollers having a heating means inside of the roller. As a roller having a heating means inside of the roller, it may be used a roller containing a metal pipe having a high heat conductivity (e.g., aluminum and iron), inside of the pipe being provided with a heating material such as a nichrome wire and the outside of the pipe being coated with a plastic such as polyethylene, polystyrene, TEFLON®. The detail of a pre-heating roller may be referred to JP-A No. 64-80962.

It is preferable to carry out pre-heating at a temperature of not more than 120° C. for a period of not more than 120 seconds.

In the invention, the imagewise exposed light sensitive layer, which are cured are at exposed portions, is developed with an alkali developer, whereby the light sensitive layer at exposed portions are removed to form an image.

In the invention, the imagewise exposed light sensitive layer, which are cured are at exposed portions, is developed with an alkali developer, whereby the light sensitive layer at exposed portions are removed to form an image.

As a developer for the present invention, a conventional alkali aqueous solution can be used.

(Heating Treatment)

In order to promote image formation reaction, to increase sensitivity and printing durability, the photosensitive printing plate material may be heated during the preparation of the printing plate.

(Post Treatment)

The printing plate after being developed may be treated with water, a rinse solution containing a surface active agent, a finisher solution or a protective gum solution containing Arabic gum or starch.

(Printing)

Printing is carried out with a printing apparatus using the planographic printing plate after image formation on the photosensitive planographic printing material of the present invention. The present invention is not limited by a kind of printing apparatus, printing sheet, printing ink, or wetting water.

EXAMPLES

Next, the present invention will be explained in the following examples, but the present invention is not limited thereto. In the examples, “parts” represents “parts by weight”, unless otherwise specified.

Examples 1-9

(Synthesis of Polymer Binder 1)

Under nitrogen flow, charged into a three-neck flask were 30 parts of methacrylic acid, 50 parts of methyl methacrylate, 20 parts of ethyl methacrylate, 250 parts of isopropyl alcohol, 250 parts of propylene glycol monomethyl ether acetate, and 3 parts of α,α'-azobisisobutylnitrile, and the resulting mixture underwent reaction for 6 hours in an oil bath at 80° C. under nitrogen flow.

After reflux was performed at the boiling point of isopropyl alcohol for one hour, 3 parts of triethylammonium chloride and 25 parts of glycidyl methacrylate were added, and the resulting mixture was allowed to react for three hours. Propylene glycol monomethyl ether acetate was then added so that the solid concentration finally reached 20 parts by weight, whereby Polymer Binder 1 Solution was obtained.

The weight average molecular weight determined employing GPC was approximately 35,000, the glass transition temperature (Tg) determined employing differential scanning colorimetry (DSC) was approximately 85° C., while the acid value was 70.

(Preparation of Support)

A 0.3 mm thick aluminum plate (material 1050, tempered at H16) was degreased while immersed into a 5 percent aqueous sodium hydroxide solution maintained at 65° C. for one minute and subsequently washed with water. The resulting degreased aluminum plate was subjected to neutralization while immersed in a 10 percent hydrochloric acid solution for one minute and then again washed with water. Subsequently, the resulting aluminum plate was subjected to electrolytic surface roughening for 60 seconds in a 0.3 weight percent aqueous nitric acid solution at 25° C., employing an alternating current at conditions of 25° C. and a current density of 100 A/$dm^2$, and was then subjected to a desmutting treatment for 10 seconds in a 5 percent aqueous sodium hydroxide solution maintained at 60° C. The resulting surface-roughened aluminum plate, which had been subjected to the desmutting treatment, was further subjected to an anodic treatment in a 15 percent sulfuric acid solution under conditions of 25° C., a current density of 10 A/$dm^2$, and a voltage of 15 V for one minute. In addition, it was made to be hydrophilic at 75° C., employing a 1 percent vinylsulfonic acid, whereby Support 1 was prepared.

At that time, the center line mean roughness (Ra) of the support surface was 0.65 μm.

(Preparation of Light-Sensitive Lithographic Printing Plate Material)

Light-sensitive Layer Liquid Coating Composition 1 of the following composition was applied onto above Support 1 employing a wire bar to result in 2.0 g/$m^2$ when dried, and dried for 1.5 minutes at 95° C. Subsequently, Oxygen Blocking Layer Liquid Coating Composition 1 was applied employing a wire bar to result in 1.5 g/$m^2$ when dried, and dried at 75° C. for 15 minutes, whereby a light-sensitive lithographic printing plate material was obtained.

(Light-Sensitive Layer Liquid Coating Composition 1)

| | |
|---|---|
| Polymerization Initiator listed in Table 2 | Added amount listed in Table 2 |
| Sensitizing dye listed in Table 2 | Added amount listed in Table 2 |
| Polymer Binder 1 solution (in terms of solids) | 45.0 parts |
| Multifunctional Oligomer M-8 (as above) | 30.0 parts |
| Tetraethylene glycol dimethacrylate | 5.0 parts |
| 30% phthalocyanine pigment dispersion (MH1454, produced by Mikuni Color Co.) | 10.0 parts |
| 2-t-Butyl-6-(3-t-butyl-2-hydroxy-5-methylbenzyl)-4-methylphenyl acrylate (SUMILIZER GS, produced by Sumitomo 3M Corp.) | 0.5 part |
| Bis(2,2,6,6-tetramethyl-4-piperidyl)sebacate (SANOL LS- 770, produced by Sankyo Life Tech Co.) | 0.2 part |
| 2-Mercaptobenzothiazole | 1.5 parts |
| 2,4,6-tris(dimethylaminomethyl)phenol | 1.5 parts |
| Fluorine based surface active agent (F-178k, produced by Dainippon Ink and Chemicals, Inc.) | 0.5 part |
| Methyl ethyl ketone | 80 parts |
| Cyclohexanone | 820 parts |

(Oxygen Blocking Layer Liquid Coating Composition 1)

| | |
|---|---|
| Polyvinyl alcohol (GOSENOL AL-05, produced by Nippon Synthetic Chemical Industry Co., Ltd.) | 85.0 parts |
| Polyvinylpyrrolidone (LUBITECH K-30, produced by BASF) | 15.0 parts |
| SURFINOL 465 (produced by Air Products Co.) | 0.2 parts |
| Water | 900 parts |

(Evaluation of Light-Sensitive Lithographic Printing Plate Materials)

(Photographic Speed)

Light-sensitive lithographic printing plate samples, prepared as above, were image-exposed at a resolution of 2,400 dpi (dpi, as described herein, refers to the number of dots per 2.54 cm), employing a CTP plate setter TIGER CAT (produced by ECRM Co.) fitted with a 30 mW violet laser.

Employed as an exposure pattern were a 100 percent image portion, and 175 LPI 50 percent square dots.

Subsequently, photographic processing was performed employing a CTP automatic processor (Raptor Polymer, produced by Glunz & Jensen Co.) provided with a preheating section which brought the plate surface to 105° C., a pre-washing section to remove the oxygen blocking layer, a development section filled with a developer having the following compositions, a washing section to remove the developer adhered onto the plate surface, a liquid gum composition (GW-3 produced by Mitsubishi Chemical Corp.

was diluted by a factor of two) to protect line image portions, and a processing section, whereby a lithographic printing plate was obtained.

The amount of minimum exposure energy, which resulted in no noticeable layer decrease in the 100 percent image portion recorded on the surface of the lithographic printing plate, was designated as recording energy and used as an index of photographic speed. As the recording energy decreases, the photographic speed increases.

Table 2 shows the results.

Based on Table 2, it is evident that light-sensitive lithographic printing plate materials employing the polymerization initiators according to the present invention result in higher photographic speed as well as excellent plate life.

| (Developer Composition (aqueous solution containing the following additives)) | |
|---|---|
| Potassium Silicate A | 8.0 percent by weight |
| NEWCOL B-13SN (produced by Nippon Nyukazai Co., Ltd.) | 3.0 percent by weight |
| Potassium hydroxide | in an amount to reach 12.3 pH |

TABLE 2

| Example No. | Polymerization Initiator (weight parts) | Sensitizing Dye (weight parts) | Photographic Speed (μJ/cm²) | Plate Life (number of printed sheets) |
|---|---|---|---|---|
| Example 1 | P-1 (4.0) | Dye14 (4.0) | 20 | up to 300,000 sheets |
| Example 2 | P-4 (2.0)<br>I-1 (3.0) | Dye02 (4.0) | 10 | at least 400,000 sheets |

TABLE 2-continued

| Example No. | Polymerization Initiator (weight parts) | Sensitizing Dye (weight parts) | Photographic Speed (μJ/cm²) | Plate Life (number of printed sheets) |
|---|---|---|---|---|
| Example 3 | P-2 (2.0)<br>I-3 (3.0) | Dye03 (4.0) | 15 | at least 400,000 sheets |
| Example 4 | P-3 (4.0)<br>I-4 (3.0) | Dye11 (2.0) | 10 | at least 400,000 sheets |
| Example 5 | H-1 (4.0) | Dye04 (4.0) | 20 | up to 350,000 sheets |
| Example 6 | H-1 (2.0)<br>I-4 (3.0) | Dye15 (2.0) | 15 | at least 400,000 sheets |
| Example 7 | H-5 (2.0)<br>I-1 (3.0) | Dye01 (4.0) | 7 | at least 400,000 sheets |
| Example 8 | H-5 (2.0)<br>I-4 (3.0) | Dye16 (2.0) | 15 | at least 400,000 sheets |
| Example 9 | H-6 (4.0)<br>I-3 (3.0) | Dye04 (4.0) | 10 | at least 400,000 sheets |
| Comparative Example 1 | CH-1 (4.0)<br>I-3 (3.0) | Dye04 (4.0) | 50 | up to 150,000 sheets |
| Comparative Example 2 | CH-2 (4.0) | Dye16 (4.0) | 100 | up to 50,000 sheets |

I-1: η-cumene-(η-cyclopentadienyl)iron hexafluorophosphate
I-2: di-methylcyclopentadienyl-Ti-bis-2,4-difluorophenyl-1-yl
I-3: bis(cyclopentadienyl)-bis(2,6-difluoro-3-(pyri-1-yl)phenyl)titanium
I-4: 2,2'-bis(2-chlorophenyl)-4,5,4',5'-tetraphenylbisimidazole Polymerization Initiators of Comparative Examples

TABLE 3

| Polymerization Initiator No. | Structure of Polymerization Initiator | Reaction Rate Constant of Electron Transfer from Semiquinone Radical |
|---|---|---|
| CH-1 | 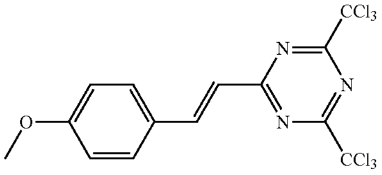 | 130 |
| CH-2 | 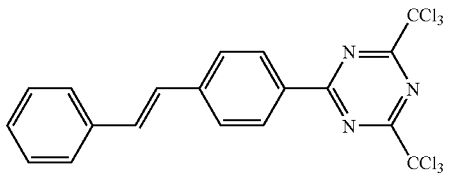 | 80 |

Examples 10-19

(Preparation of Lithographic Printing Plate Materials)

Light-sensitive Layer Liquid Coating Composition 2, having the following composition, was applied onto aforesaid Support 1, employing a wire bar to result in 2.0 $g/m^2$ when dried, and subsequently the resulting coating was dried at 95° C. for 1.5 minutes, whereby a light-sensitive lithographic printing plate material was obtained.

(Light-Sensitive Layer Liquid Coating Composition 2)

| | |
|---|---|
| Polymerization Initiator list in Table 4 | Added amount listed in Table 4 |
| Sensitizing dye IR-Dye01 | 2.5 parts |
| Binder 1 solution (in terms of solids) | 45.0 parts |
| Multifunctional Oligomer M-8 (as above) | 30.0 parts |
| Tetraethylene glycol dimethacrylate | 5.0 parts |
| 30% phthalocyanine pigment dispersion (MH1454, produced by Mikuni Color Co.) | 10.0 parts |
| 2-t-Butyl-6-(3-t-butyl-2-hydroxy-5-methylbenzyl)-4-methylphenyl acrylate (SUMILIZER GS, produced by Sumitomo 3M Corp.) | 0.5 part |
| Bis(2,2,6,6-tetramethyl-4-piperidyl)sebacate (SANOL LS770, produced by Sankyo Life Tech Co.) | 0.2 part |
| 2-Mercaptobenzothiazole | 1.5 parts |
| Fluorine based surface active agent (F-178k, produced by Dainippon Ink and Chemicals Inc.) | 0.5 part |
| Methyl ethyl ketone | 80 parts |
| Cyclohexanone | 820 parts |

(Evaluation of Lithographic Printing Plate Materials)

Photographic speed and plate life were evaluated in the same manner as Examples 1-4, except that a plate setter (TREND SETTER 3244, produced by Creo Co.) provided with a light source of 830 nm was used for image exposure, and RAPTOR THERMAL (produced by Glunz & Jensen Co.) having neither a pre-heating section nor a pre-washing section was employed as a CPT automatic processor. Table 4 shows the results.

Based on Table 4, it is evident that light-sensitive lithographic printing plate materials employing the polymerization initiators according to the present invention result in higher photographic speed as well as excellent plate life.

(Sensitizing Dye IR-Dye01)

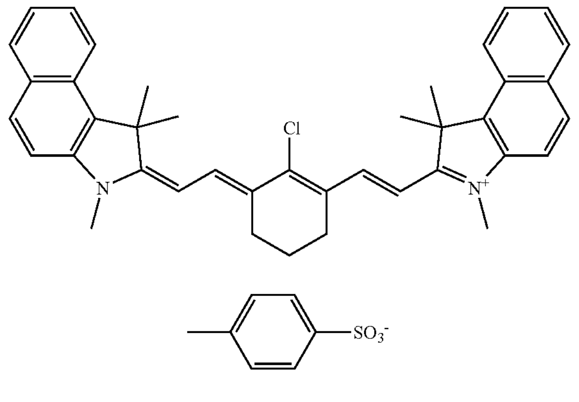

TABLE 4

| Example No. | Polymerization Initiator (weight parts) | Photographic Speed ($\mu J/cm^2$) | Plate Life (as number of printed sheets) |
|---|---|---|---|
| Example 10 | P-1 (4.0) | 100 | 350,000 sheets |
| Example 11 | P-4 (4.0) I-1 (3.0) | 80 | at least 400,000 sheets |
| Example 12 | P-2 (2.0) I-4 (3.0) | 60 | at least 400,000 sheets |
| Example 13 | P-3 (4.0) I-5 (3.0) | 80 | at least 400,000 sheets |
| Example 14 | P-3 (4.0) I-6 (3.0) | 80 | at least 400,000 sheets |
| Example 15 | H-1 (4.0) | 80 | at least 400,000 sheets |
| Example 16 | H-1 (2.0) I-4 (3.0) | 50 | at least 400,000 sheets |
| Example 17 | H-5 (2.0) I-5 (3.0) | 60 | at least 400,000 sheets |
| Example 18 | H-5 (2.0) I-6 (3.0) | 60 | at least 400,000 sheets |
| Example 19 | H-6 (4.0) I-1 (3.0) | 100 | up to 350,000 sheets |
| Comparative Example 3 | CH-1 (4.0) I-5 (3.0) | 250 | up to 200,000 sheets |
| Comparative Example 4 | CH-2 (4.0) | 350 | up to 150,000 sheets |

I-5: tri(4-isopropylphenyl)sulfonium p-toluenesulfonate
I-6: bis(4-(1,1-dimethylpropyl)phenyl)iodonium p-toluenesulfonate

What is claimed is:

1. A photosensitive composition, comprising:
(A) a sensitizing dye;
(B) a photopolymerization initiator of halide compound having a carbon-halogen bond in the molecule or a porphyrin metal complex;
(c) a polymerizable compound having an ethylenically unsaturated bond; and
(D) a polymer binder,
wherein the photopolymerization initiator exhibits a reaction rate constant with a semiquinone radical anion in the range of $2.0\times10^2$ to $1.0\times10^8$ ($mol^{-1}\cdot l\cdot s^{-1}$).

2. The photosensitive composition of claim 1,
wherein photopolymerization initiator exhibits a reaction rate constant with a semiquinone radical anion in the range of $1.0\times10^4$ to $1.0\times10^8$ ($mol^{-1}\cdot l\cdot s^{-1}$).

3. The photosensitive composition of claim 1,
wherein the sensitizing dye is a coumarin derivative.

4. The photosensitive composition of claim 1,
wherein the sensitizing dye is a styryl dye.

5. The photosensitive composition of claim 1,
wherein the sensitizing dye is a boron containing compound.

6. The photosensitive composition of claim 1,
wherein the sensitizing dye is a cyanine dye.

7. The photosensitive composition of claim 1,
wherein the sensitizing dye is a squarylium dye.

8. A planographic printing plate material, comprising a support having thereon a photosensitive layer containing the photosensitive composition of claim 1.

9. The photosensitive composition of claim 1,
wherein the photopolymerization initiator is any one of the following compounds 1 to 11;

10. The photosensitive composition of claim 1, wherein a content of the photopolymerization initiator is 0.01 to 30 weight % based on the total weight of the photosensitive composition.

-continued

*1

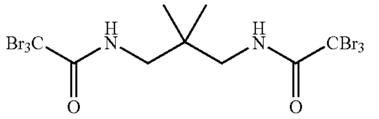

*2

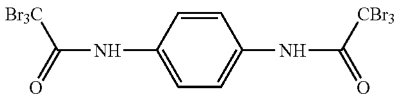

*3

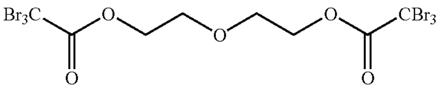

*4

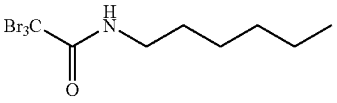

*5

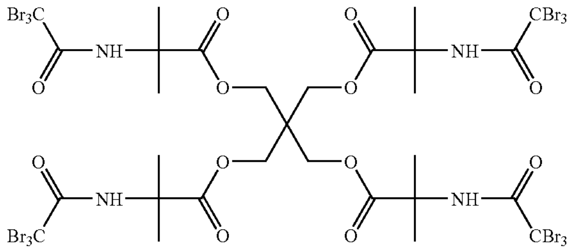

*6

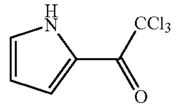

*7

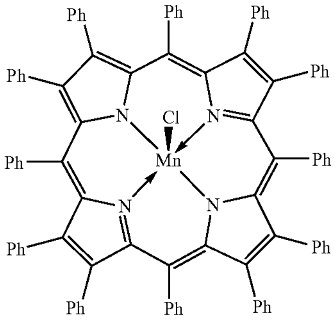

*8

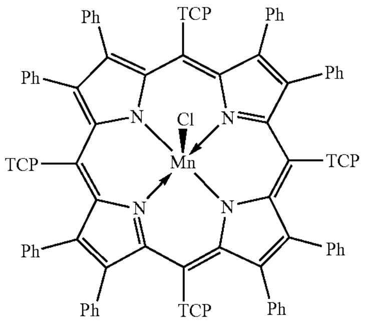

TCP: 2, 3, 5-trichlorophenol

*9

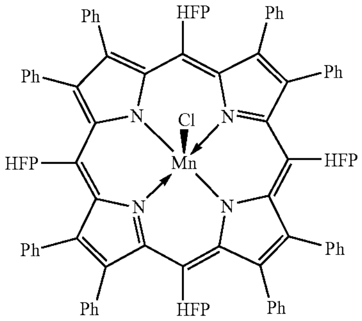

PFP: 2, 3, 4, 5, 6-pentafluorophenyl

*10

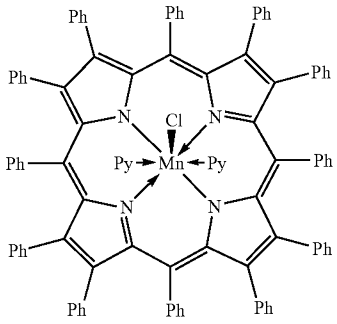

Py: pyridyl

*11

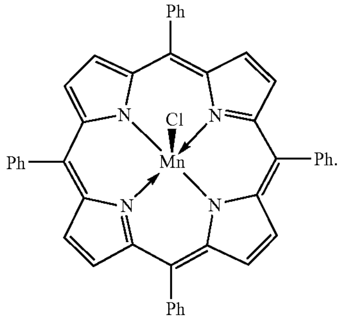

Py: pyridyl

11. A method of forming a planographic printing plate, comprising the steps of:

irradiating a portion of the planographic printing plate material of claim 8 with a laser having an emission wavelength between 350 and 450 nm so as to polymerize the polymerizable compound in the irradiated portion; and developing the irradiated planographic printing plate material to eliminate a non-irradiated portion of the planographic printing plate material.

12. A method of forming a planographic printing plate, comprising the steps of:

irradiating a portion of the planographic printing plate material of claim 8 with a laser having an emission wavelength between 750 and 900 nm so as to polymerize the polymerizable compound in the irradiated portion; and developing the irradiated planographic printing plate material to eliminate a non-irradiated portion of the planographic printing plate material.

* * * * *